United States Patent
Dando (10) Patent No.: US 6,955,725 B2
(45) Date of Patent: Oct. 18, 2005

(54) REACTORS WITH ISOLATED GAS CONNECTORS AND METHODS FOR DEPOSITING MATERIALS ONTO MICRO-DEVICE WORKPIECES

(75) Inventor: Ross S. Dando, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 10/222,289

(22) Filed: Aug. 15, 2002

(65) Prior Publication Data

US 2004/0083960 A1 May 6, 2004

(51) Int. Cl.⁷ .......................... C23C 16/00; C23F 1/00; H01L 21/306
(52) U.S. Cl. .............. 118/715; 156/345.29; 156/345.33
(58) Field of Search ...................... 118/715; 156/345.33

(56) References Cited

U.S. PATENT DOCUMENTS

| | | | | |
|---|---|---|---|---|
| 3,630,881 A | * | 12/1971 | Wester et al. .......... | 204/298.09 |
| 4,590,042 A | * | 5/1986 | Drage .................... | 422/186.06 |
| 5,136,975 A | * | 8/1992 | Bartholomew et al. ..... | 118/715 |
| 5,377,429 A | | 1/1995 | Sandhu et al. | |
| 5,433,835 A | * | 7/1995 | Demaray et al. ...... | 204/298.09 |
| 5,480,818 A | | 1/1996 | Matsumoto et al. | |
| 5,595,606 A | * | 1/1997 | Fujikawa et al. .......... | 118/725 |
| 5,766,364 A | * | 6/1998 | Ishida et al. ................ | 118/725 |
| 5,788,778 A | | 8/1998 | Shang et al. .................... | 134/1 |
| 5,851,849 A | | 12/1998 | Comizzoli et al. | |
| 5,879,459 A | | 3/1999 | Gadgil et al. | |
| 5,908,947 A | | 6/1999 | Vaartstra | |
| 5,932,286 A | | 8/1999 | Beinglass et al. ...... | 427/255.18 |
| 6,042,652 A | | 3/2000 | Hyun et al. | |
| 6,109,206 A | | 8/2000 | Maydan et al. ........ | 118/723 IR |
| 6,139,700 A | | 10/2000 | Kang et al. | |
| 6,143,659 A | | 11/2000 | Leem | |
| 6,144,060 A | | 11/2000 | Park et al. | |
| 6,174,377 B1 | | 1/2001 | Doering et al. | |
| 6,174,809 B1 | | 1/2001 | Kang et al. | |
| 6,203,613 B1 | | 3/2001 | Gates et al. | |
| 6,237,529 B1 | | 5/2001 | Spahn | |
| 6,245,192 B1 | * | 6/2001 | Dhindsa et al. ......... | 156/345.34 |
| 6,270,572 B1 | | 8/2001 | Kim et al. | |
| 6,287,965 B1 | | 9/2001 | Kang et al. | |
| 6,297,539 B1 | | 10/2001 | Ma et al. | |
| 6,305,314 B1 | | 10/2001 | Sneh et al. | |
| 6,329,297 B1 | | 12/2001 | Balish et al. ................ | 438/714 |
| 6,374,831 B1 | | 4/2002 | Chandran et al. ............ | 134/1.1 |
| 6,387,207 B1 | | 5/2002 | Janakiraman et al. ....... | 156/345 |
| 2001/0045187 A1 | | 11/2001 | Uhlenbrock | |
| 2002/0020353 A1 | * | 2/2002 | Redemann et al. ......... | 118/715 |
| 2003/0037729 A1 | * | 2/2003 | DeDontney et al. ........ | 118/715 |

OTHER PUBLICATIONS

U.S. Appl. No. 09/805,620, filed Mar. 13, 2001, Carpenter et al.

(Continued)

*Primary Examiner*—Rudy Zervigon
(74) *Attorney, Agent, or Firm*—Perkins Coie LLP (57) ABSTRACT

Reactors having isolated gas connectors, systems that include such reactors, and methods for depositing materials onto micro-devices workpieces are disclosed herein. In one embodiment, a reactor for depositing material onto a micro-device workpiece includes a reaction chamber, a lid attachable to the reaction chamber, and a connector. The connector has a first portion coupled to the lid, a second portion coupled to the reaction chamber, a gas passageway extending through the first and second portions, and a seal. The seal can surround the gas passageway between the first and second portions. The first portion is detachably coupled to the second portion. In one aspect of this embodiment, the connector can also include a second gas passageway extending through the first and second portions and a second seal surrounding the second gas passageway between the first and second portions.

56 Claims, 4 Drawing Sheets

OTHER PUBLICATIONS

U.S. Appl. No. 09/810,387, filed Mar. 15, 2001, Carpenter et al.

UC Berkeley Extension, Engineering, "Atomic Layer Deposition," Dec. 11, 2001, 5 pages, http://www.unex.berkeley.edu/eng/br335/1–1.html.

IPS Integrated Process Systems, Dec. 11, 2001, 1 page, http://www.ips–tech.com/eng/main.htm.

IPS Integrated Process Systems, Nano–ALD, Dec. 11, 2001, 2 pages, http://www.ips–tech.com/eng/pro–p2.htm.

IPS Integrated Process Systems, Nano–ALD, Dec. 11, 2001, 2 pages, http://www.ips–tech.com/eng/pro–p2–2.htm.

Deublin Company, Precision Rotating Unions, Steam Joints and Siphon Systems "Precision Rotating Connections for Water, Steam, Air, Hydraulic, Vacuum, Coolant and Hot Oil Service," http://www.deublin.com, Feb. 4, 2002, 1 page.

Deublin Company, "Rotating Unions," http://www.deublin.com/products/rotatingunions.htm, Feb. 4, 2002, 1 page.

Deublin Company, "Sealing," http://www.deublin.com/products/sealing.htm, Feb. 4, 2002, 2 pages.

Electronics Times, "Atomic Layer Deposition Chamber Works at Low Temperatures," 2 pages, Dec. 11, 2001, 2001 CMP Europe Ltd., http://www.electronicstimes.com/story/OEG20010719S0042.

The University of Adelaide Australia, Department of Chemistry, Stage 2 Chemistry Social Relevance Projects, "Spectroscopy," 2 pages, Feb. 9, 2002, http://www.chemistry.adelaide.edu/au/external/Soc–Rel/content/Spectros.htm.

* cited by examiner

REACTORS WITH ISOLATED GAS CONNECTORS AND METHODS FOR DEPOSITING MATERIALS ONTO MICRO-DEVICE WORKPIECES

TECHNICAL FIELD

The present invention is related to reactors with isolated gas connectors and methods for depositing materials in thin film deposition processes used in the manufacturing of micro-devices.

BACKGROUND

Thin film deposition techniques are widely used in the manufacturing of micro-devices to form a coating on a workpiece that closely conforms to the surface topography. The size of the individual components in the devices is constantly decreasing, and the number of layers in the devices is increasing. As a result, the density of components and the aspect ratios of depressions (e.g., the ratio of the depth to the size of the opening) are increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a thin solid film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Figure 1A:
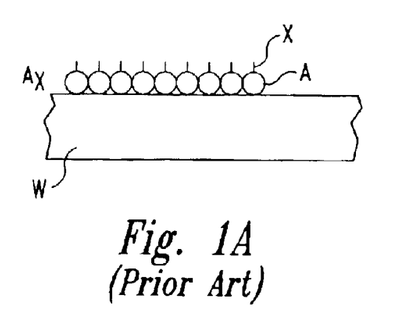
FIGS. 1A and 1B are schematic cross-sectional views of stages in ALD processing in accordance with the prior art.
Figure 1B:
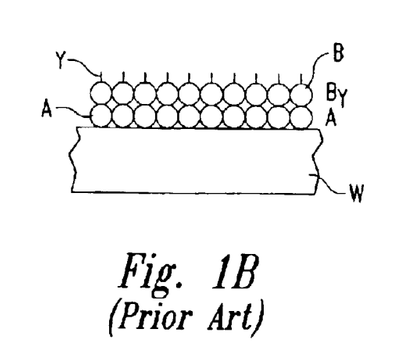

Atomic Layer Deposition (ALD) is another thin film deposition technique. FIGS. 1A and 1B schematically illustrate the basic operation of ALD processes. Referring to FIG. 1A, a layer of gas molecules $A_x$ coats the surface of a workpiece W. The layer of $A_x$ molecules is formed by exposing the workpiece W to a precursor gas containing $A_x$ molecules, and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

Figure 2:
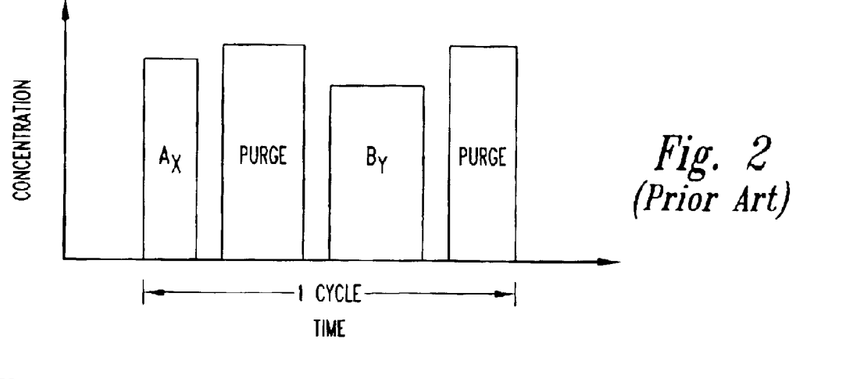
FIG. 2 is a graph illustrating a cycle for forming a layer using ALD techniques in accordance with the prior art.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing, several cycles are repeated to build a thin film on a workpiece having the desired thickness. For example, each cycle may form a layer having a thickness of approximately 0.5–1.0 Å, and thus it takes approximately 60–120 cycles to form a solid layer having a thickness of approximately 60 Å.

Figure 3:
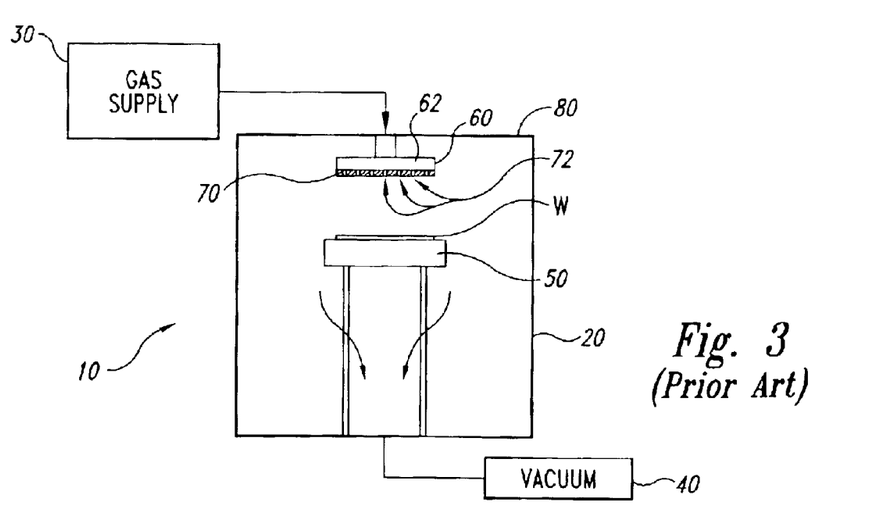
FIG. 3 is a schematic representation of a system including a reactor for depositing a material onto a microelectronic workpiece in accordance with the prior art.

FIG. 3 schematically illustrates an ALD reactor 10 having a reaction chamber 20 coupled to a gas supply 30 and a vacuum 40. The reactor 10 also includes a lid 80 coupled to the reaction chamber 20, a heater 50 that supports the workpiece W, and a gas dispenser 60 in the reaction chamber 20. The gas dispenser 60 includes a plenum 62 operatively coupled to the gas supply 30 and a distributor plate 70 having a plurality of holes 72. In operation, the heater 50 heats the workpiece W to a desired temperature, and the gas supply 30 selectively injects the first precursor $A_x$, the purge gas, and the second precursor $B_y$ as shown above in FIG. 2. The vacuum 40 maintains a negative pressure in the chamber to draw the gases from the gas dispenser 60 across the workpiece W and then through an outlet of the reaction chamber 20.

One drawback of ALD processing is that it has a relatively low throughput compared to CVD techniques. For example, ALD processing typically takes about eight to eleven seconds to perform each $A_x$-purge-$B_y$-purge cycle. This results in a total process time of approximately eight to eleven minutes to form a single thin layer of only 60 Å. In contrast to ALD processing, CVD techniques only require about one minute to form a 60 Å thick layer. The low throughput of existing ALD techniques limits the utility of the technology in its current state because ALD may be a bottleneck in the overall manufacturing process. Thus, it would be useful to increase the throughput of ALD techniques so they could be used in a wider range of applications.

Another drawback of both ALD and CVD processing is the difficulty in servicing the components in the reaction chamber 20 and/or the lid 80. The lid 80 must be removed from the reaction chamber 20 to clean the gas dispenser 60. In conventional systems, gas lines between the gas supply 30 and the lid 80 are coupled together with VCR connections that can degrade with use. For example, VCR connections typically develop leaks and need to be replaced after only a few cycles of being disconnected and reconnected. Replacing the VCR connections requires substantial downtime because it usually involves cutting the gas lines and welding new VCR connections onto the lines. This causes a significant reduction in throughput, and the new welds may fail or leak. Therefore, there is a significant need to reduce the downtime for servicing components in CVD and ALD chambers.

SUMMARY

The present invention is directed toward reactors having isolated gas connectors, systems that include such reactors, and methods for depositing materials onto micro-device workpieces. In one embodiment, a reactor for depositing material onto a micro-device workpiece includes a reaction chamber, a lid attachable to the reaction chamber, and a connector. The connector has a first portion coupled to the lid, a second portion coupled to the reaction chamber, a gas passageway extending through the first portion and the second portion, and a seal. The seal surrounds the gas passageway between the first portion and the second portion to prevent gas from leaking from the gas passageway. The first portion is detachably coupled to the second portion. In one aspect of this embodiment, the connector also includes a second gas passageway extending through the first and second portions and a second seal surrounding the second gas passageway. In another aspect of this embodiment, the first and second portions can be coupled to exterior or interior walls of the lid and reaction chamber, respectively. In yet another aspect of this embodiment, the first and second portions can be mounted directly to the lid and the reaction chamber, respectively.

In another aspect of this embodiment, the connector can further include a temperature control element proximate to the gas passageway to regulate the temperature of the gas. The temperature control element can be any device that heats and/or cools the gas, such as an electric heater, a gas heater, or a heat exchanger. In still another aspect of this embodiment, the first portion and/or the second portion can include a low pressure recess proximate to the gas passageway. In this embodiment, the first portion and/or the second portion can also include a leakage channel coupled to the low pressure recess to remove from the connector gas that leaks from the gas passageway into the low pressure recess.

The connectors can be used to perform several methods for depositing materials onto micro-device workpieces. In one embodiment, a method for providing gas to the reactor includes flowing a gas through a first gas passageway section in the first block coupled to the reaction chamber and flowing the gas through a second gas passageway section in the second block coupled to the lid. The first gas passageway section is sealably coupled to the second gas passageway section, and the first block is detachably coupled to the second block. In a further aspect of this embodiment, the method can include heating the gas to a desired temperature in the first and/or second gas passageway section.

DETAILED DESCRIPTION

The following disclosure describes several embodiments of reactors having isolated gas connectors, systems including such reactors, and methods for depositing materials onto micro-device workpieces. Many specific details of the invention are described below with reference to reactors for depositing materials onto micro-device workpieces. The term "micro-device workpiece" is used throughout to include substrates upon which and/or in which microelectronic devices, micromechanical devices, data storage elements, read/write components, and other features are fabricated. For example, micro-device workpieces can be semiconductor wafers such as silicon or gallium arsenide wafers, glass substrates, insulative substrates, and many other types of materials. The term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4–6 and the following text to provide a thorough understanding of particular embodiments of the invention. A person skilled in the art will understand, however, that the invention may have additional embodiments, or that the invention may be practiced without several of the details of the embodiments shown in FIGS. 4–6.

A. Deposition Systems

Figure 4:
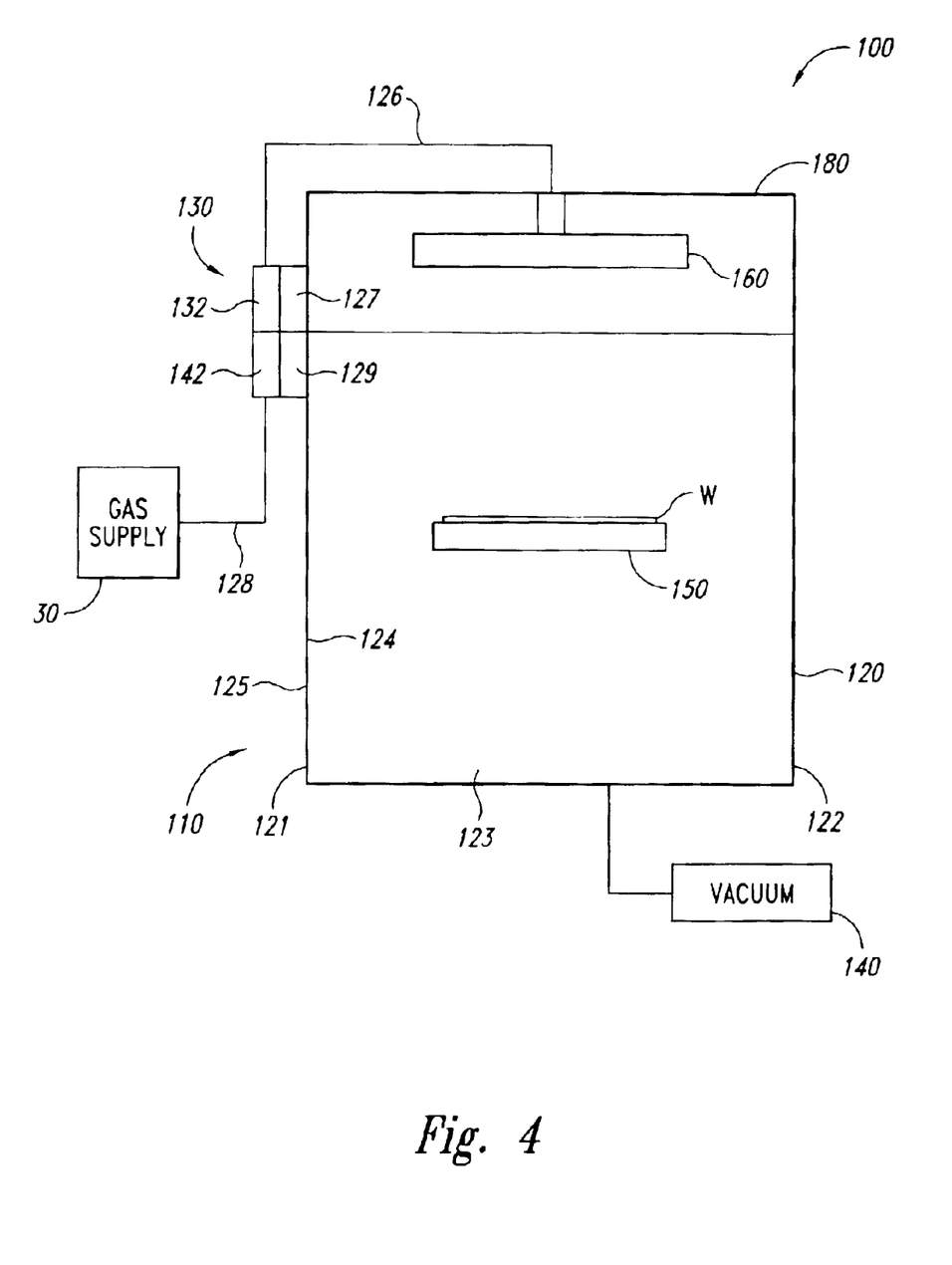
FIG. 4 is a schematic side view of a system including a reactor for depositing material onto a micro-device workpiece in accordance with one embodiment of the invention.

FIG. 4 is a schematic side view of a system 100 for depositing material onto a micro-device workpiece W in accordance with one embodiment of the invention. In this embodiment, the system 100 includes a reactor 110 having a reaction chamber 120 and a lid 180 coupled to the reaction chamber 120. The reaction chamber 120 can include a workpiece holder 150 that supports the workpiece W and a gas dispenser 160 coupled to a gas supply 30. The workpiece holder 150 can be a heater or heat sink that holds the workpiece W at a desired temperature. The gas dispenser 160 is positioned over the workpiece holder 150 to deliver the gas(es) to the workpiece W. In the embodiment shown in FIG. 4, the lid 180 carries the gas dispenser 160. The reaction chamber 120 can be coupled to a vacuum 140 to draw gases from the gas dispenser 160 across the workpiece W and then out of the reaction chamber 120.

The reactor 110 further includes a connector 130 having a first portion 132 coupled to the lid 180 and a second portion 142 coupled to the reaction chamber 120. In the illustrated embodiment, the first portion 132 is attached to a spacer 127 which is mounted to the lid 180, and the second portion 142 is attached to a spacer 129 which is mounted to the reaction chamber 120. In other embodiments, the first portion 132 and the second portion 142 can be mounted directly to the lid 180 and the reaction chamber 120, respectively. In the illustrated embodiment, the connector 130 is coupled to an external wall 125 on a first side 121 of the reaction chamber 120 and the lid 180. The connector 130 can alternatively be coupled to other portions of the reaction chamber 120 and the lid 180, such as a second side 122 or a third side 123, in other embodiments. Furthermore, in still other embodiments, the connector 130 can be coupled to internal walls 124 of the reaction chamber 120 and the lid 180.

The first portion 132 of the connector 130 is coupled to the gas dispenser 160 by a first gas conduit 126. The second portion 142 is coupled to the gas supply 30 by a second gas conduit 128. The first and second portions 132 and 142 include at least one internal gas passageway that will be discussed in detail below. The connector 130 thereby connects the first gas conduit 126 to the second gas conduit 128 so that gas can flow from the gas supply 30 to the gas dispenser 160.

B. Connectors

Figure 5:
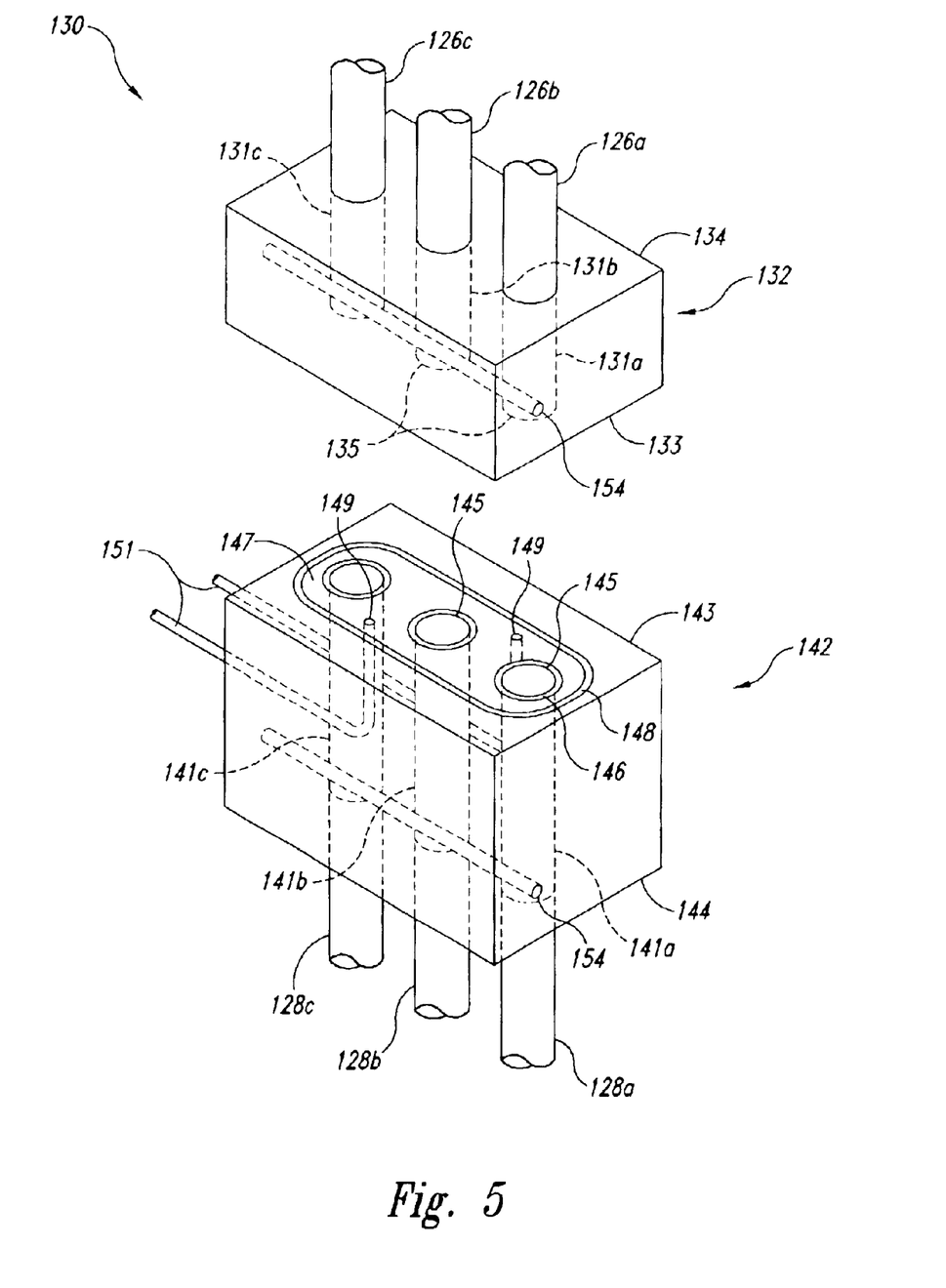
FIG. 5 is an isometric view of the connector shown in FIG. 4 with the first portion spaced apart from the second portion.

FIG. 5 is an isometric view of one embodiment of the connector 130 shown in FIG. 4 with the first portion 132 disconnected from the second portion 142. In this embodiment, the first portion 132 is a first block that includes a plurality of first gas passageway sections (identified individually as 131a–c) extending from a first side 133 to a second side 134. Each first section 131a–c is coupled to a corresponding first gas conduit (identified individually as 126a–c) proximate to the second side 134. Similarly, the second portion 142 is a second block that includes a plurality of second gas passageway sections (identified individually as 141a–c) extending from a first side 143 to a second side 144. Each second section 141a–c is coupled to a corresponding second gas conduit (identified individually as 128a–c) proximate to the second side 144. Furthermore, each first section 131a–c in the first portion 132 is axially aligned with a corresponding second section 141a–c in the second portion 142 to define individual gas passageways. For example, first section 131a is aligned with second section 141a so that gas can flow from the second gas conduit 128a, through the second and first sections 141a and 131a, and then through the first gas conduit 126a. The gas passageway sections 131a and 141a accordingly define a first passageway through the connector 130 for transporting a first gas. The gas passageway sections 131b and 141b define a second passageway through the connector 130 for transporting a second gas, and the gas passageway sections 131c and 141c define a third passageway through the connector 130 for transporting a third gas. Each passageway contains a separate, discrete flow of a gas to prevent the individual gas flows from mixing with each other in the conduits 126 and 128. In other embodiments, the connector 130 can have a different number of gas passageways. In a further aspect of the illustrated embodiment, the connector 130 can be made of a noncorrosive material, such as stainless steel or invar, that is compatible with caustic gases.

The connector 130 can also include seals 146 between inlets 135 of the first gas passageway sections 131a–c and inlets 145 of the second gas passageway sections 141a–c. The seals 146 prevent gases from leaking while flowing between the first portion 132 and the second portion 142. In other embodiments, the first side 143 of the second portion 142 and/or the first side 133 of the first portion 132 can include grooves circumscribing the inlets 135 and 145 that are sized to seat the seals 146. The seals 146 can be O-rings, gaskets or metal rings. Alternatively, the seals 146 can be a raised ridge surrounding each of the inlets 135 and a corresponding flat surface or depression around each of the inlets 145, such as a knife edge seal. It will be appreciated that the ridges can surround the inlets 145 and the receiving surfaces can surround the inlets 135. Moreover, the seals 146 can be a combination of moveable seals (e.g., O-rings) and fixed seals (e.g., knife-edge seals) around each inlet pair.

The second portion 142 can also include a low pressure recess 147 in the first side 143 and leakage channels 151 coupled to the low pressure recess 147 to remove leaked or spilled gas from inside the connector 130. The seals 146 and the inlets 145 can be located within the low pressure recess 147. Inlets 149 connect the leakage channels 151 to the low pressure recess 147. In one embodiment, a vacuum (not shown) can be coupled to the leakage channels 151 to create the low pressure in the low pressure recess 147 and to remove the leaked gas from the low pressure recess 147. The low pressure in the low pressure recess 147 prevents leaked gas from contaminating the discrete gas flows in the passageway sections 131a–c and 141a–c. The connector 130 of the illustrated embodiment further includes a seal 148 circumscribing the low pressure recess 147 to prevent leaked gas from passing out of the low pressure recess 147. In other embodiments, the connector 130 may not include the seal 148 circumscribing the low pressure recess 147. In additional embodiments, the connector 130 may not include the low pressure recess 147, or may have a low pressure recess with a different configuration, such as that described below with reference to FIG. 6. In still other embodiments, the first portion 132 may have the low pressure recess 147.

Several embodiments of the connector 130 optionally include temperature control elements 154 positioned proximate to the gas passageway sections 131a–c and 141a–c. In many embodiments, the temperature control elements 154 heat and/or cool each gas passageway section 131a–c and 141a–c individually to maintain an optimal temperature for each specific gas. The temperature control elements 154, however, can heat the gas passageway sections 131a–c and 141a–c collectively as a group in other embodiments. The temperature control elements 154 can be electric heaters, gas heaters, heat exchangers, or other devices to heat and/or cool the gas passageway sections 131a–c and 141a–c. Each temperature control element 154 can be a single unit with discrete portions or several units to control the temperature of each gas passageway section 131a–c and 141a–c individually. In other embodiments, the first portion 132 and/or the second portion 142 may not include the temperature control element 154.

In operation, the first portion 132 and the second portion 142 of the connector 130 are detachably coupled together so that gases flow from the gas supply 30 (FIG. 4) through the connector 130 to the gas distributor 160 (FIG. 4). If gas leaks while flowing from the second gas passageway sections 141a–c to the first gas passageway sections 131a–c, the low pressure recess 147 entraps the leaked gas for removal via the leakage channels 151.

Referring to FIG. 4, one advantage of the illustrated embodiment is that the lid 180 can be removed from the reaction chamber 120 without disconnecting a VCR connection in the gas conduits 126 and 128. The connector 130 eliminates the need for VCR connections that are subject to premature failure and instead provides a system with a more robust and/or replaceable seal. Several embodiments of the connector are expected to reduce the need to replace worn or faulty VCR connections. Accordingly, the illustrated embodiment reduces the downtime required to service components in the reaction chamber 120, such as replacing faulty VCR connections.

Another advantage of the illustrated embodiment is the ability to control the temperature of each gas just before introducing the gases to the gas distributor 160 (FIG. 4). Several embodiments of the connector 130 with temperature control elements 154 bring the individual gas flows to the desired temperatures in the gas conduits 126 and 128. Maintaining the desired temperature of each gas reduces condensation and degradation of the gas in the gas conduits 126 and 128. Furthermore, the temperature control elements 154 can superheat the gases just before they enter the reaction chamber 120 to produce smaller droplets. Smaller droplets are advantageous because they form a more uniform surface on the workpiece W.

Figure 6:
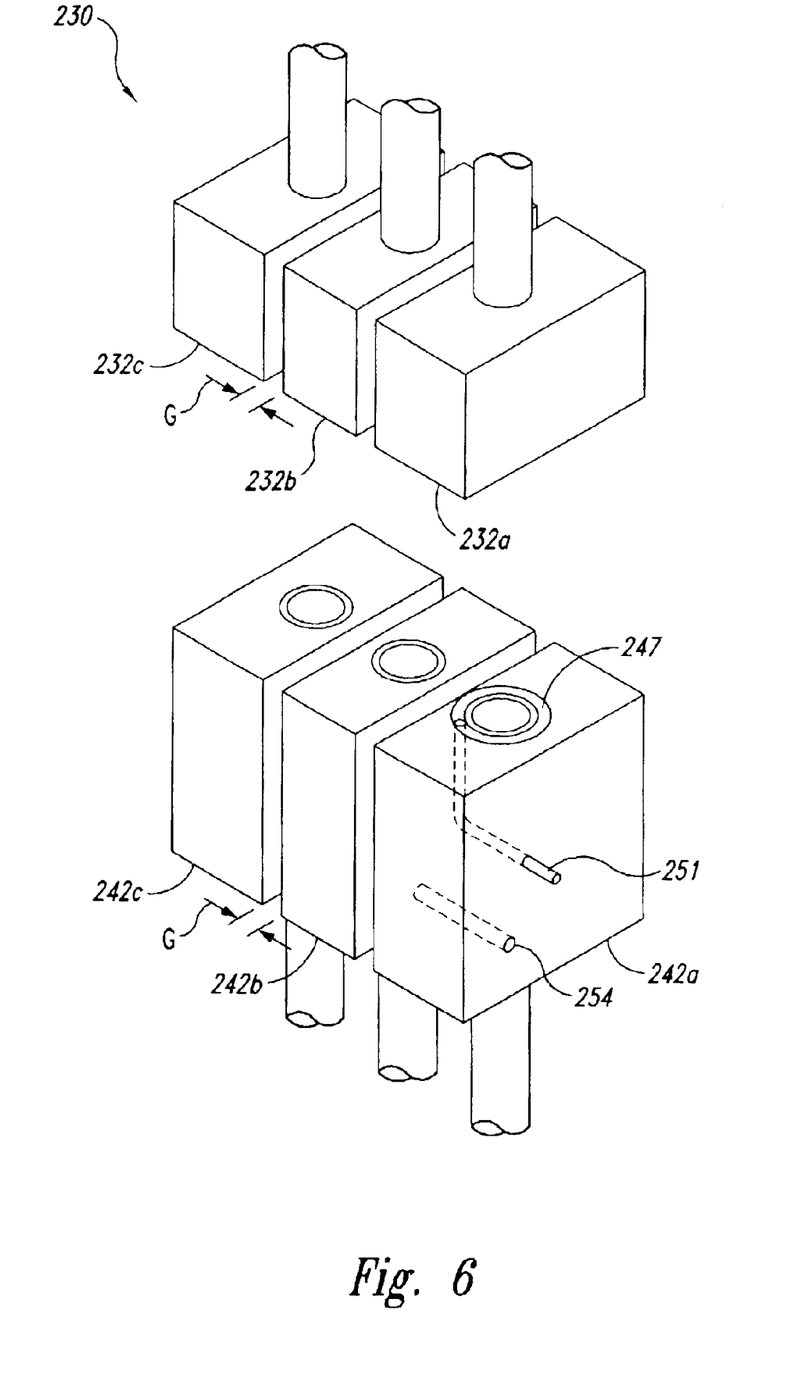
FIG. 6 is an isometric view of a connector having first portions spaced apart from second portions in accordance with another embodiment of the invention.

FIG. 6 is an isometric view of a connector 230 having first portions (identified individually as 232a–c) spaced apart from second portions (identified individually as 242a–c) in accordance with another embodiment of the invention. The first portions 232a–c are spaced apart from each other by a gap G, and each first portion 232a–c is coupled to the lid 180

(FIG. 4). Similarly, the second portions 242a–c are spaced apart from each other by the gap G, and each second portion 242a–c is coupled to the reaction chamber 120 (FIG. 4). In the illustrated embodiment, the second portion 242a includes a low pressure recess 247, a leakage channel 251, and a temperature control element 254, all of which are similar to those discussed above with reference to FIG. 5. In additional embodiments, the second portion 242a may not include all of these elements. In other embodiments, some or all of the first and second portions 232a–c and 242a–c may also include low pressure recesses, leakage conduits, and/or temperature control elements. One advantage of the embodiment illustrated in FIG. 6 is that the gap G between each first portion 232a–c and between each second portion 242a–c helps thermally insulate each portion from the adjacent portion. Furthermore, the gap G permits a cooling and/or heating gas, such as air, to move between the portions 232a–c and 242a–c to cool and/or heat each portion individually.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A reactor for depositing material onto a micro-device workpiece, comprising:
    a reaction chamber defined by a bottom portion, a top portion, and side portions;
    a lid attachable to the reaction chamber; and
    a connector having a first portion coupled external to the lid, a second portion coupled external to the reaction chamber, a gas passageway extending through the first portion and the second portion, and a seal between the first and second portions surrounding the gas passageway, wherein the first portion is detachably coupled to the second portion.

2. The reactor of claim 1 wherein the connector further comprises a temperature control element at least proximate to the gas passageway.

3. The reactor of claim 1 wherein the connector further comprises a means for controlling the temperature of a gas in the gas passageway.

4. The reactor of claim 1 wherein the seal is positioned between a first section of the gas passageway in the first portion and a second section of the gas passageway in the second portion.

5. The reactor of claim 1 wherein at least one of the first portion and the second portion comprises a low pressure recess proximate to the gas passageway, and wherein at least one of the first portion and the second portion comprises a leakage channel coupled to the low pressure recess.

6. The reactor of claim 1 wherein at least one of the first portion and the second portion comprises a low pressure recess proximate to the gas passageway, wherein at least one of the first portion and the second portion comprises a leakage channel coupled to the low pressure recess, wherein the seal is a first seal and the first seal is positioned between a first section of the gas passageway in the first portion and a second section of the gas passageway in the second portion, and wherein the connector further comprises a second seal circumscribing the low pressure recess.

7. The reactor of claim 1 wherein:
    the first portion comprises a first block and the second portion comprises a second block;
    the gas passageway comprises a first gas passageway having a first section in the first block and a second section in the second block; and
    the connector further comprises a second gas passageway having a first section extending through the first block and a second section extending through the second block.

8. The reactor of claim 1 wherein the connector further comprises a temperature control element at least proximate to the gas passageway, wherein the seal is positioned between a first section of the gas passageway in the first portion and a second section of the gas passageway in the second portion, and wherein at least one of the first portion and the second portion comprises a low pressure recess proximate to the gas passageway and a leakage channel coupled to the low pressure recess.

9. The reactor of claim 1 wherein the gas passageway is a first gas passageway and the seal is a first seal, wherein the connector further comprises a second seal and a second gas passageway extending through the first portion and the second portion, wherein the first seal is positioned between a first section of the first gas passageway in the first portion and a second section of the first gas passageway in the second portion, and wherein the second seal is positioned between a first section of the second gas passageway in the first portion and a second section of the second gas passageway in the second portion.

10. The reactor of claim 1 wherein the lid has a first internal wall and the reaction chamber has a second internal wall, wherein the first portion of the connector is coupled to the first internal wall and the second portion of the connector is coupled to the second internal wall.

11. The reactor of claim 1 wherein the lid has a first external wall and the reaction chamber has a second external wall, wherein the first portion of the connector is coupled to the first external wall and the second portion of the connector is coupled to the second external wall.

12. The reactor of claim 1 wherein the connector is a manifold.

13. The reactor of claim 1 wherein the connector further comprises a means for removing gas that leaked within the connector.

14. The reactor of claim 1 wherein the first portion is mounted to the lid and the second portion is mounted to the reaction chamber.

15. A reactor for depositing material onto a micro-device workpiece, comprising:
    a reaction chamber defined by a bottom portion, a top portion, and side portions;
    a lid attachable to the reaction chamber; and
    a receptacle having a first block mounted external to the lid, a second block mounted external to the reaction chamber, a plurality of gas channels extending through the first and second blocks, and a plurality of seals, wherein each gas channel has a first section in the first block and a corresponding second section in the second block, and wherein one of the seals is positioned around each interface between the first section and the second section.

16. The reactor of claim 15 wherein the receptacle further comprises a temperature control element at least proximate to one of the gas channels.

17. The reactor of claim 15 wherein at least one of the first and second blocks comprises a low pressure recess proximate to the plurality of gas channels, and wherein at least one of the first and second blocks comprises a leakage channel coupled to the low pressure recess.

18. The reactor of claim 15 wherein at least one of the first and second blocks comprises a low pressure recess proximate to the plurality of gas channels, wherein at least one of the first and second blocks comprises a leakage channel coupled to the low pressure recess, and wherein the receptacle comprises a second seal circumscribing the low pressure recess.

19. A reactor for depositing material onto a micro-device workpiece, comprising:
   a reaction chamber defined by a bottom portion, a top portion, and side portions;
   a lid attachable to the reaction chamber; and
   a connector having a first portion coupled external to the lid, a second portion coupled external to the reaction chamber, and a seal, wherein the first portion has a first gas passageway section and the second portion has a second gas passageway section in fluid communication with the first gas passageway section, wherein the seal is between the first gas passageway section and the second gas passageway section, and wherein the first portion is detachably coupled to the second portion.

20. The reactor of claim 19 wherein the connector further comprises a temperature control element at least proximate to the first and/or second gas passageway section.

21. The reactor of claim 19 wherein the connector further comprises a means for controlling the temperature of a gas in the first and/or second gas passageway section.

22. The reactor of claim 19 wherein at least one of the first and second portions further comprises a low pressure recess proximate to the first and/or second gas passageway section, and wherein at least one of the first and second portions further comprises a leakage channel coupled to the low pressure recess.

23. The reactor of claim 19 wherein at least one of the first and second portions further comprises a low pressure recess proximate to the first and/or second gas passageway section, wherein at least one of the first and second portions further comprises a leakage channel coupled to the low pressure recess, wherein the seal is a first seal, and wherein the connector further comprises a second seal circumscribing the low pressure recess.

24. The reactor of claim 19 wherein the connector further comprises a means for removing gas that leaked within the connector.

25. A reactor for depositing material onto a micro-device workpiece, comprising;
   a reaction chamber defined by a bottom portion, a top portion, and side portions;
   a lid attachable to the reaction chamber; and
   a connector having a first portion coupled external to the lid, a second portion coupled external to the reaction chamber, a gas passageway extending through the first and second portions, and a seal between the first and second portions that surrounds the gas passageway, wherein at least one of the first and second portions has a low pressure recess at least proximate to the gas passageway, wherein at least one of the first and second portions has a leakage channel coupled to the low pressure recess, and wherein the first portion is detachably coupled to the second portion.

26. The reactor of claim 25 wherein the connector further comprises a temperature control element at least proximate to the gas passageway.

27. The reactor of claim 25 wherein the connector further comprises a means for controlling the temperature of a gas in the gas passageway.

28. The reactor of claim 25 wherein:
   the first portion comprises a first block and the second portion comprises a second block;
   the gas passageway comprises a first gas passageway having a first section in the first block and a second section in the second block; and
   the connector further comprises a second gas passageway having a first section extending through the first block and a second section extending through the second block.

29. The reactor of claim 25 wherein the seal is a first seal, and wherein the connector further comprises a second seal circumscribing the low pressure recess.

30. The reactor of claim 25 wherein the lid has a first internal wall and the reaction chamber has a second internal wall, wherein the first portion of the connector is coupled to the first internal wall and the second portion of the connector is coupled to the second internal wall.

31. The reactor of claim 25 wherein the lid has a first external wall and the reaction chamber has a second external wall, wherein the first portion of the connector is coupled to the first external wall and the second portion of the connector is coupled to the second external wall.

32. A reactor for depositing material onto a micro-device workpiece, comprising:
   a reaction chamber defined by a bottom portion, a top portion, and side portions;
   a lid attachable to the reaction chamber; and
   a connector having a first portion coupled external to the lid, a second portion coupled external to the reaction chamber, a gas passageway extending through the first and second portions, and a seal between the first and second portions that surrounds the gas passageway at an interface between the first and second portions, wherein at least one of the first and second portions has a temperature control element at least proximate to the gas passageway, and wherein the first portion is detachably coupled to the second portion.

33. The reactor of claim 32 wherein at least one of the first and second portions further comprises a low pressure recess proximate to the gas passageway, and wherein at least one of the first and second portions further comprises a leakage channel coupled to the low pressure recess.

34. The reactor of claim 32 wherein at least one of the first and second portions further comprises a low pressure recess proximate to the gas passageway, wherein at least one of the first and second portions further comprises a leakage channel coupled to the low pressure recess, wherein the seal is a first seal and the first seal is positioned between a first section of the gas passageway in the first portion and a second section of the gas passageway in the second portion, and wherein the connector further comprises a second seal circumscribing the low pressure recess.

35. The reactor of claim 32 wherein:
   the first portion comprises a first block and the second portion comprises a second block;
   the gas passageway comprises a first gas passageway having a first section in the first block and a second section in the second block; and
   the connector further comprises a second gas passageway having a first section extending through the first block and a second section extending through the second block.

36. The reactor of claim 32 wherein the gas passageway is a first gas passageway, the temperature control element is a first temperature control element, and the seal is a first seal, wherein the connector further comprises a second seal, a second gas passageway extending through the first and second portions, and a second temperature control element at least proximate to the second gas passageway, wherein the second seal is positioned between the first and second portions surrounding the second gas passageway.

37. A reactor for depositing material onto a micro-device workpiece, comprising:
a reaction chamber defined by a bottom portion, a top portion, and side portions;
a lid attachable to the reaction chamber; and
a connector having a first portion coupled external to the lid, a second portion coupled external to the reaction chamber, a gas passageway extending through the first and second portions, and a means for sealing a first section of the gas passageway in the first portion to a second section of the gas passageway in the second portion, wherein the first portion is detachably coupled to the second portion.

38. The reactor of claim 37 wherein the connector further comprises a temperature control element at least proximate to the gas passageway.

39. The reactor of claim 37 wherein the connector further comprises a means for controlling the temperature of a gas in the gas passageway.

40. The reactor of claim 37 wherein at least one of the first and second portions comprises a low pressure recess proximate to the gas passageway, and wherein at least one of the first and second portions comprises a leakage channel coupled to the low pressure recess.

41. A system for depositing material onto a micro-device workpiece, comprising:
a gas supply assembly having a first gas source and a second gas source;
a reaction chamber defined by a bottom portion, a top portion, and side portions, the reaction chamber coupled to the gas supply assembly;
a lid attachable to the reaction chamber;
a workpiece supported in the reaction chamber;
a gas distributor in the reaction chamber; and
a connector having a first portion coupled external to the lid, a second portion coupled external to the reaction chamber, a first gas passageway coupled to the first gas source, a second gas passageway coupled to the second gas source, and seals between the first and second portions surrounding the first and second gas passageways, wherein the first and second gas passageways extend through the first and second portions, and wherein the first portion is detachably coupled to the second portion.

42. The system of claim 41 wherein the connector further comprises a temperature control element at least proximate to the first and/or second gas passageway.

43. The system of claim 41 wherein at least one of the first and second portions comprises a low pressure recess proximate to the first and/or second gas passageway, and wherein at least one of the first and second portions comprises a leakage channel coupled to the low pressure recess.

44. A system for depositing material onto a micro-device workpiece, comprising:
a gas supply assembly having a plurality of gas sources;
a reaction chamber defined by a bottom portion, a top portion, and side portions, the reaction chamber coupled to the gas supply assembly;
a lid attachable to the reaction chamber;
a workpiece support in the reaction chamber;
a gas distributor in the reaction chamber; and
a receptacle having a first block mounted external to the lid, a second block mounted external to the reaction chamber, a plurality of gas channels extending through the first and second blocks, and a plurality of seals, wherein each gas channel is coupled to one of the gas sources, wherein each gas channel has a first section in the first block and a corresponding second section in the second block, and wherein one of the seals is positioned around each interface between the first section and the second section.

45. The system of claim 44 wherein the receptacle further comprises a temperature control element at least proximate to one of the gas channels.

46. The system of claim 44 wherein at least one of the first and second blocks comprises a low pressure recess proximate to the plurality of gas channels, and wherein at least one of the first and second blocks comprises a leakage channel coupled to the low pressure recess.

47. A system for depositing material onto a micro-device workpiece, comprising:
a gas supply assembly having a gas source;
a reaction chamber defined by a bottom portion, a top portion, and side portions, the reaction chamber coupled to the gas supply assembly;
a lid attachable to the reaction chamber;
a workpiece support in the reaction chamber;
a gas distributor in the reaction chamber; and
a connector having a first portion coupled external to the lid, and a second portion coupled external to the reaction chamber, and a seal, wherein the first portion has a first gas passageway section and the second portion has a second gas passageway section in fluid communication with the first gas passageway section and the gas source, wherein the seal is proximate to an interface of the first and second gas passageway sections, and wherein the first portion is detachably coupled to the second portion.

48. The system of claim 47 wherein the connector further comprises a temperature control element at least proximate to the first and/or second gas passageway sections.

49. The system of claim 47 wherein the connector further comprises a means for controlling the temperature of a gas in the first and/or second gas passageway sections.

50. The system of claim 47 wherein at least one of the first and second portions comprises a low pressure recess proximate to the first and/or second gas passageway sections, and wherein at least one of the first and second portions comprises a leakage channel coupled to the low pressure recess.

51. A system for depositing material onto a micro-device workpiece, comprising:
a gas supply assembly having a gas source;
a reaction chamber defined by a bottom portion, a top portion, and side portions, the reaction chamber coupled to the gas supply assembly;
a lid attachable to the reaction chamber;
a workpiece support in the reaction chamber;
a gas distributor in the reaction chamber; and
a connector having a first portion coupled external to the lid, a second portion coupled external to the reaction chamber, a gas passageway coupled to the gas source and extending through the first and second portions, and a means for sealing a first section of the gas passageway in the first portion to a second section of the gas passageway in the second portion, wherein the first portion is detachably coupled to the second portion.

52. The system of claim 51 wherein the connector further comprises a temperature control element at least proximate to the gas passageway.

53. The system of claim 51 wherein the connector further comprises a means for controlling the temperature of a gas in the gas passageway.

54. A system for depositing material onto a micro-device workpiece, comprising:
- a gas supply assembly having a gas source;
- a reaction chamber defined by a bottom portion, a top portion, and side portions, the reaction chamber coupled to the gas supply assembly;
- a lid attachable to the reaction chamber a workpiece support in the reaction chamber;
- a gas distributor in the reaction chamber; and
- a connector having a first portion coupled external to the lid, a second portion coupled external to the reaction chamber, a gas passageway extending through the first and second portions, and a seal between the first and second portions that surrounds the gas passageway, wherein at least tone of the first and second portions has a temperature control element at least proximate to the gas passageway, and wherein the first portion is detachably coupled to the second portion.

55. The system of claim 54 wherein at least one of the first and second portions further comprises a low pressure recess proximate to the gas passageway, and wherein at least one of the first and second portions further comprises a leakage channel coupled to the low pressure recess.

56. The system of claim 54 wherein the gas passageway is a first gas passageway, the temperature control element is a first temperature control element, and the seal is a first seal, wherein the connector further comprises a second seal, a second gas passageway extending through the first and second portions, and a second temperature control element at least proximate to the second gas passageway, wherein the second seal is positioned between a first section of the second gas passageway in the first portion and a second section of the second gas passageway in the second portion.

* * * * *